United States Patent
Meng

(10) Patent No.: US 11,366,482 B2
(45) Date of Patent: Jun. 21, 2022

(54) BAKING EQUIPMENT FOR USE IN DISPLAY PANEL MANUFACTURING PROCESS

(71) Applicant: TCL China Star Optoelectronics Technology Co., Ltd., Shenzhen (CN)

(72) Inventor: Xiaolong Meng, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 220 days.

(21) Appl. No.: 16/649,674

(22) PCT Filed: Mar. 13, 2020

(86) PCT No.: PCT/CN2020/079199
§ 371 (c)(1),
(2) Date: Mar. 23, 2020

(87) PCT Pub. No.: WO2021/168915
PCT Pub. Date: Sep. 2, 2021

(65) Prior Publication Data
US 2022/0026938 A1     Jan. 27, 2022

(30) Foreign Application Priority Data

Feb. 27, 2020   (CN) .......................... 202010132478.5

(51) Int. Cl.
| | |
|---|---|
| *G05D 23/19* | (2006.01) |
| *H01L 21/67* | (2006.01) |
| *F27B 7/00* | (2006.01) |
| *F27D 5/00* | (2006.01) |
| *F27D 9/00* | (2006.01) |
| *F24H 1/10* | (2022.01) |
| *F24H 9/20* | (2022.01) |
| *G05D 7/06* | (2006.01) |
| *F27B 17/00* | (2006.01) |

(52) U.S. Cl.
CPC .......... *G05D 23/1931* (2013.01); *F24H 1/10* (2013.01); *F24H 9/2007* (2013.01); *F27B 17/0025* (2013.01); *F27D 5/0037* (2013.01); *F27D 9/00* (2013.01); *G05D 7/0682* (2013.01); *H01L 21/67103* (2013.01); *F27D 2009/0083* (2013.01)

(58) Field of Classification Search
CPC .... G05D 23/1931; G05D 7/0682; F24H 1/10; F24H 9/2007; F24H 9/00; F27B 17/0025; F27D 5/0037; F27D 2009/0083; H01L 21/67103
See application file for complete search history.

(56) References Cited

U.S. PATENT DOCUMENTS

| | | | | |
|---|---|---|---|---|
| 2014/0096716 A1* | 4/2014 | Chung | .............. | H01L 21/67109 118/725 |
| 2016/0161152 A1* | 6/2016 | Solomon | ................. | F24S 10/50 126/643 |

FOREIGN PATENT DOCUMENTS

| | | | | |
|---|---|---|---|---|
| CN | 101046638 A | * | 10/2007 | ....... H01L 21/67063 |
| CN | 10505798 | * | 3/2016 | |
| CN | 108735628 A | * | 11/2018 | ....... H01L 21/68764 |

* cited by examiner

Primary Examiner — Steven S Anderson, II

(57) ABSTRACT

The present application provides a baking equipment applied in a display panel manufacturing process. In the present application, the first and second pipes are communicated with each other and evenly distributed inside the baking plate, so that the heating liquid injected from the head end of the first pipe heats the baking plate evenly during flowing through the first and second pipes, which improves the uniformity of the baking temperature of the TFT array substrate to be baked by the baking plate, thereby ensuring the stability of the baking process of the TFT array substrate.

16 Claims, 4 Drawing Sheets

BAKING EQUIPMENT FOR USE IN DISPLAY PANEL MANUFACTURING PROCESS

RELATED APPLICATIONS

This application is a National Phase of PCT Patent Application No. PCT/CN2020/079199 having International filing date of Mar. 13, 2020, which claims the benefit of priority of Chinese Patent Application No. 202010132478.5 filed on Feb. 27, 2020. The contents of the above applications are all incorporated by reference as if fully set forth herein in their entirety.

FIELD AND BACKGROUND OF INVENTION

The present application relates to a field of display technology, and in particular, to a baking equipment for use in a display panel manufacturing process.

With the increase of the requirements for resolution of a display panel, the requirements of a display panel manufacturing process are becoming more and more stringent. A thin film transistor (TFT) array substrate is an important part of the display panel. In a baking process of the TFT array substrate, the channel of the TFT is particularly sensitive to the baking temperature. If the baking temperature is not uniform, the baking process of the TFT array substrate will be extremely unstable.

In the prior art, a baking equipment is configured to bake the TFT array substrate, wherein the baking method adopts zone temperature-controlled baking. The baking equipment and zone temperature-controlled baking method are specifically described below.

FIG. 1 is a schematic cross-sectional structure diagram of a baking equipment in the prior art. As shown in FIG. 1, the baking equipment includes a main body 1, a baking chamber 10 provided inside the main body 1, and a baking plate provided inside the baking chamber 10. The baking plate 20 is configured to carry a TFT array substrate 2 to be baked, and bake the TFT array substrate 2 to be baked.

FIG. 2 is a schematic diagram of a zone temperature-controlled baking method in the prior art. As shown in FIG. 2, the baking plate 20 is divided into 9 zones by the dotted grid, and a heater (each solid circle represents a heater) is provided below each zone correspondingly, and a temperature sensor is set correspondingly under each zone (each hollow circle represents a temperature sensor), wherein a heater below a certain zone is configured to heat the zone, and a temperature sensor below a certain zone is configured to monitor the temperature of the zone, so as to control the heater to heat the zone when the temperature of the zone is lower than a preset threshold.

However, with the time passing, the difference in heating efficiency between heaters and the difference in temperature measurement accuracy between temperature sensors will cause the temperature of each zone of the baking plate 20 to be inconsistent, resulting in an uneven baking temperature of the TFT array substrate to be baked by the baking plate 20, thereby causing the baking process of the TFT array substrate 2 to be extremely unstable.

SUMMARY OF THE INVENTION

The present application provides a baking equipment for use in a display panel manufacturing process to solve the technical problem of uneven baking temperature of a TFT array substrate to be baked in the existing baking equipment.

In a first aspect, the present application provides a baking equipment for use in a display panel manufacturing process, including a main body, a baking chamber disposed inside the main body, and a baking plate provided inside the baking chamber, wherein a liquid passing hole is defined inside the baking plate, the liquid passing hole includes a first pipe and a second pipe, the first pipe and the second pipe are evenly distributed inside the baking plate, and a tail end of the first pipe is connected to a head end of the second pipe to form a passage; and the head end of the first pipe is configured to receive a heating liquid injected from external, and the heating liquid is configured to uniformly heat the baking plate during flowing through the passage, and the tail end of the second pipe is configured to discharge the heating liquid.

The first pipe and the second pipe are spirally wound with each other.

Each of the first pipe and the second pipe is distributed in a loop shape inside the baking plate.

The baking equipment for use in the display panel manufacturing process further includes:

a third pipe, a fourth pipe and a circulation pump, wherein a head end of the third pipe is connected to a liquid outlet of the circulation pump, and a tail end of the third pipe is connected to the head end of the first pipe;

a head end of the fourth pipe is connected to the tail end of the second pipe, and a tail end of the fourth pipe is connected to a liquid inlet of the circulation pump; and the circulation pump is configured to circulate the heating liquid in a passage constituted by the third pipe, the first pipe, the second pipe, the fourth pipe, and the circulation pump.

The baking equipment for use in the display panel manufacturing process further includes:

a first temperature sensor and a second temperature sensor, wherein the first temperature sensor is disposed on an outer surface of the third pipe and is configured to monitor a temperature of the heating liquid injected into the first pipe;

the second temperature sensor is disposed on an outer surface of the fourth pipe and is configured to monitor a temperature of the heating liquid discharged from the second pipe; and correspondingly, the circulation pump is further configured to control a flow speed of circulating the heating fluid according to a difference between a temperature monitored by the first temperature sensor and a temperature monitored by the second temperature sensor.

The baking equipment for use in the display panel manufacturing process further includes:

a heater configured to heat the heating liquid when the temperature monitored by the first temperature sensor is less than a first preset threshold or when the temperature monitored by the second temperature sensor is less than a second preset threshold.

The third pipe includes a first sub-segment and a second sub-segment, a head end of the first sub-segment is connected to the liquid outlet of the circulation pump, a tail end of the first sub-segment is connected to a first heating inlet of the heater, a head end of the second sub-segment is connected to a first heating outlet of the heater, and a tail end of the second sub-segment is connected to the head end of the first pipe; and the fourth pipe includes a third sub-segment and a fourth sub-segment, a head end of the third sub-segment is connected to the tail end of the second pipe, a tail end of the third sub-segment is connected to a second heating inlet of the heater, and a head end of the fourth sub-segment is connected to a second heating outlet of the heater, and a tail end of the fourth sub-segment is connected to the liquid inlet of the circulation pump.

The baking equipment for use in the display panel manufacturing process further includes:

a fifth pipe spirally wound on outer surfaces of an entire body constituted by the third pipe and the fourth pipe, for passing cooling water to cool the heating liquid flowing through the third pipe and the fourth pipe.

S head end of the fifth pipe is configured to connect a water outlet of a process cooling water system to receive the cooling water injected from the water outlet;

a tail end of the fifth pipe is configured to connect a water inlet of the process cooling water system to discharge the cooling water flowing through the fifth pipe to the water inlet; and the process cooling water system is configured to maintain a circulating supply of the cooling water.

The baking equipment for use in the display panel manufacturing process further includes:

a thermal insulation cotton covering an outer surface of the fifth pipe

In a second aspect, the present application further provides a baking equipment applied in a baking equipment for use in a display panel manufacturing process, including a main body, a baking chamber disposed inside the main body, and a baking plate provided inside the baking chamber, wherein a liquid passing hole is defined inside the baking plate, the liquid passing hole includes a first pipe and a second pipe, the first pipe and the second pipe are evenly distributed inside the baking plate, and a tail end of the first pipe is connected to a head end of the second pipe to form a passage; and the head end of the first pipe is configured to receive a heating liquid injected from external, and the heating liquid is configured to uniformly heat the baking plate during flowing through the passage, and the tail end of the second pipe is configured to discharge the heating liquid, wherein a diameter of each of the first pipe and the second pipe ranges from 5 to 50 mm.

The first pipe and the second pipe are spirally wound with each other.

Each of the first pipe and the second pipe is distributed in a loop shape inside the baking plate.

The baking equipment for use in the display panel manufacturing process further includes:

a third pipe, a fourth pipe and a circulation pump, wherein a head end of the third pipe is connected to a liquid outlet of the circulation pump, and a tail end of the third pipe is connected to the head end of the first pipe;

a head end of the fourth pipe is connected to the tail end of the second pipe, and a tail end of the fourth pipe is connected to a liquid inlet of the circulation pump; and the circulation pump is configured to circulate the heating liquid in a passage constituted by the third pipe, the first pipe, the second pipe, the fourth pipe, and the circulation pump.

The baking equipment for use in the display panel manufacturing process further includes:

a first temperature sensor and a second temperature sensor, wherein the first temperature sensor is disposed on an outer surface of the third pipe and is configured to monitor a temperature of the heating liquid injected into the first pipe;

the second temperature sensor is disposed on an outer surface of the fourth pipe and is configured to monitor a temperature of the heating liquid discharged from the second pipe; and correspondingly, the circulation pump is further configured to control a flow speed of circulating the heating fluid according to a difference between a temperature monitored by the first temperature sensor and a temperature monitored by the second temperature sensor.

The baking equipment for use in the display panel manufacturing process further includes:

a heater configured to heat the heating liquid when the temperature monitored by the first temperature sensor is less than a first preset threshold or when the temperature monitored by the second temperature sensor is less than a second preset threshold.

The third pipe includes a first sub-segment and a second sub-segment, a head end of the first sub-segment is connected to the liquid outlet of the circulation pump, a tail end of the first sub-segment is connected to a first heating inlet of the heater, a head end of the second sub-segment is connected to a first heating outlet of the heater, and a tail end of the second sub-segment is connected to the head end of the first pipe; and the fourth pipe includes a third sub-segment and a fourth sub-segment, a head end of the third sub-segment is connected to the tail end of the second pipe, a tail end of the third sub-segment is connected to a second heating inlet of the heater, and a head end of the fourth sub-segment is connected to a second heating outlet of the heater, and a tail end of the fourth sub-segment is connected to the liquid inlet of the circulation pump.

The baking equipment for use in the display panel manufacturing process further includes:

a fifth pipe spirally wound on outer surfaces of an entire body constituted by the third pipe and the fourth pipe, for passing cooling water to cool the heating liquid flowing through the third pipe and the fourth pipe.

a head end of the fifth pipe is configured to connect a water outlet of a process cooling water system to receive the cooling water injected from the water outlet;

a tail end of the fifth pipe is configured to connect a water inlet of the process cooling water system to discharge the cooling water flowing through the fifth pipe to the water inlet; and the process cooling water system is configured to maintain a circulating supply of the cooling water.

The baking equipment for use in the display panel manufacturing process further includes:

a thermal insulation cotton covering an outer surface of the fifth pipe

In the present application, the first and second pipes are communicated with each other and evenly distributed inside the baking plate, so that the heating liquid injected from the head end of the first pipe heats the baking plate evenly during flowing through the first and second pipes, which improves the uniformity of the baking temperature of the TFT array substrate to be baked by the baking plate, thereby ensuring the stability of the baking process of the TFT array substrate.

DESCRIPTION OF SPECIFIC EMBODIMENTS OF THE INVENTION

In order to make the purpose, technical solution, and effect of the present application clearer and more definite, the present application is further described in detail below with reference to the accompanying drawings and examples. It should be understood that the specific embodiments described herein are only used to explain the present application, and are not used to limit the present application.

Figure 1:
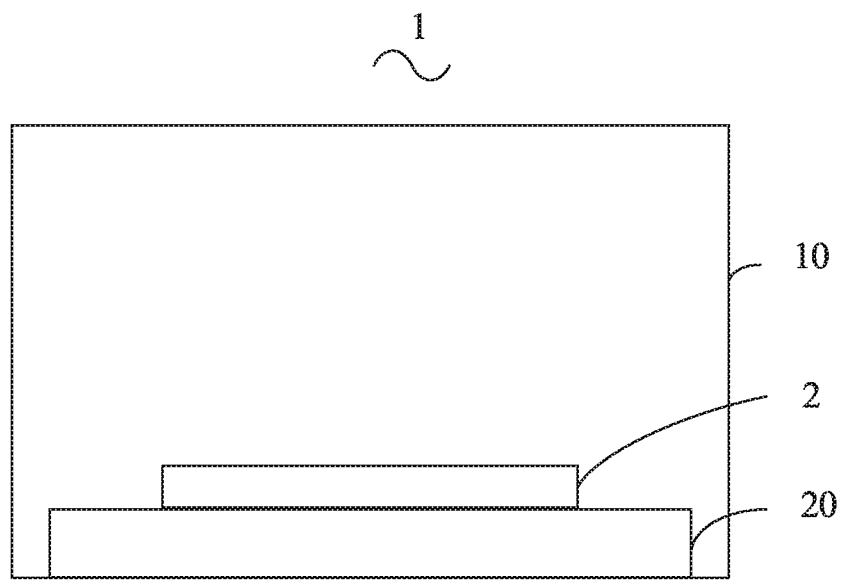
FIG. 1 is a schematic cross-sectional structure diagram of a baking equipment in the prior art.
Figure 2:
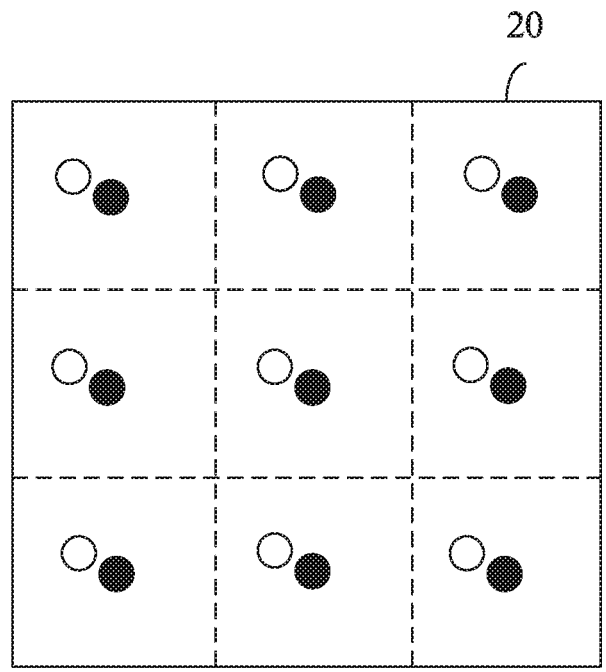
FIG. 2 is a schematic diagram of a zone temperature-controlled baking method in the prior art.

The present application provides a baking equipment for use in a display panel manufacturing process. As shown in FIG. 1, the baking equipment includes a main body 1, and a baking chamber 10 disposed inside the main body 1, and a baking plate 20 provided inside the baking chamber 10. The baking plate 20 is configured to carry the TFT array substrate 2 to be baked, and to bake the TFT array substrate 2 to be baked. It should be noted that the substrate to be baked is not limited to the TFT array substrate 2, and the TFT array substrate 2 is selected as the substrate in the present application for example only.

Figure 3:
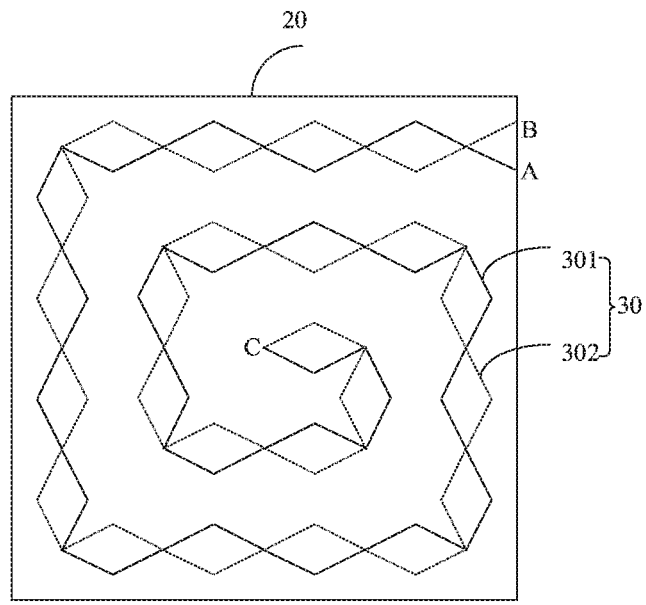
FIG. 3 is a schematic diagram of a liquid heating and baking method provided by the present application.

FIG. 3 is a schematic diagram of a liquid heating and baking method provided in the present application. As shown in FIG. 3, a liquid passing hole 30 is provided inside the baking plate 20. The liquid passing hole 30 includes a first pipe 301 and a second pipe 302. The first pipe 301 and the second pipe 302 are uniformly distributed inside the baking plate 20.

The liquid passing hole 30 refers to a hole through which liquid can pass. In this embodiment, the liquid passing hole 30 includes two pipes, namely the first pipe 301 and the second pipe 302. It can be understood that the first pipe 301 and the second pipe 302 are both pipes through which liquid can pass. In addition, the diameters of the first pipe 301 and the second pipe 302 generally range from 5 to 50 mm.

The first pipe 301 is uniformly distributed inside the baking plate 20. The uniform distribution here may be a loop-shaped distribution. As shown in FIG. 3, the first pipe 301 is distributed in a loop shape inside the baking plate 20.

The second pipe 302 is uniformly distributed inside the baking plate 20. The uniform distribution here may be a loop-shaped distribution. As shown in FIG. 3, the second pipe 302 is distributed in a loop shape inside the baking plate 20.

A tail end of the first pipe 301 and the head end of the second pipe 302 are connected to form a passage with a connection point designated as the point C.

A head end of the first pipe 301 (the end where the point A is located) is configured to receive a heating liquid injected from external, and the heating liquid is configured to heat the baking plate 20 during flowing through the passage (that is, passing through the points A-C-B), wherein since the passage is evenly distributed inside the baking plate 20, the heating liquid can uniformly heat the baking plate 20 when flowing through the passage.

The tail end of the second pipe 302 (the end where the point B is located) is configured to discharge the heating liquid.

It should be noted that the heating liquid is usually a liquid whose temperature is higher than the ambient temperature, such that during the heating liquid flows through the passage, the heating liquid can transfer its own heat to the baking plate 20 by heat exchange, to make the temperature of the baking plate 20 rise, and the baking plate 20 bakes the TFT array substrate 2 to be baked carried by the baking plate 20.

The baking equipment provided in the present application includes a first pipe 301 and a second pipe 302 that are communicated with each other and evenly distributed inside the baking plate 20, so that the heating liquid injected from the head end of the first pipe heats the baking plate evenly during flowing through the first and second pipes, which improves the uniformity of the baking temperature of the TFT array substrate to be baked by the baking plate, thereby ensuring the stability of the baking process of the TFT array substrate.

In some embodiments, the first pipe 301 and the second pipe 302 are spirally wound with each other.

As shown in FIG. 3, the first pipe 301 and the second pipe 302 are spirally wound with each other inside the baking plate 20, and the two pipes are twisted with each other in a twist-like manner.

At this time, the heating liquid flowing through the first pipe 301 is heat-exchanged with the heating liquid flowing through the second pipe 302, so that the temperature of the heating liquid during the inflow and outflow is constant, which avoids the risk of the heat loss of the heating liquid caused by an excessively long path, and makes the heating liquid heat the baking plate 20 more uniformly, further improving the uniformity of the baking temperature of the TFT array substrate 2 to be baked by the baking plate 20, thereby further ensuring the stability of the baking process of the TFT array substrate 2.

In some embodiments, both the first pipe 301 and the second pipe 302 are distributed in a loop shape inside the baking plate 20.

Referring to FIG. 3, the first pipe 301 are distributed in a loop shape inside the baking plate 20, and the second pipe 302 are distributed in a loop shape inside the baking plate 20.

Figure 4:
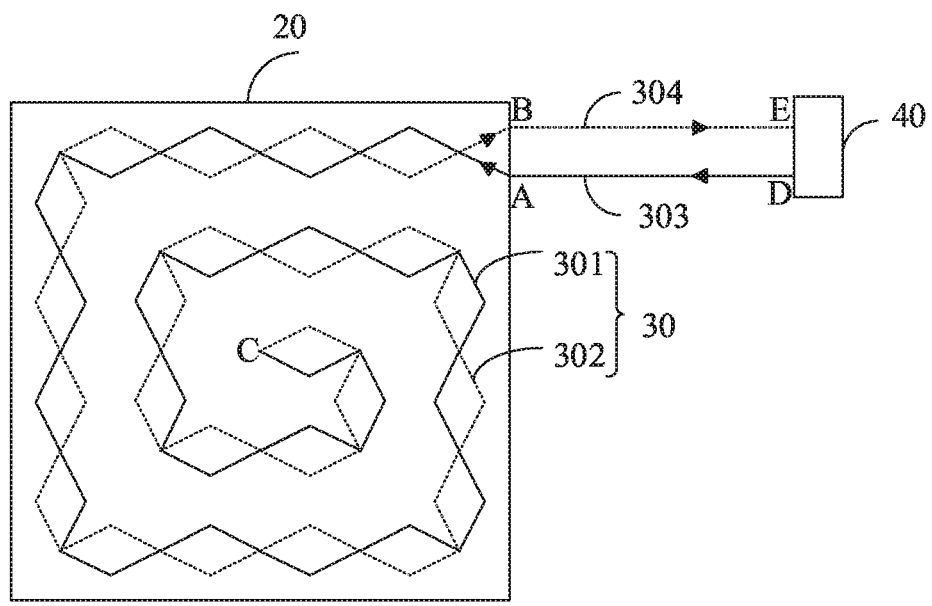
FIG. 4 is a schematic diagram of a circulating flow of a heating liquid provided by the present application.

In some embodiments, the baking equipment is further described in conjunction with FIG. 4. FIG. 4 is a schematic diagram of a circulating flow of a heating liquid provided by the present application. As shown in FIG. 4, the baking equipment further includes:

a third pipe 303, a fourth pipe 304, and a circulation pump 40.

A head end of the third pipe 303 is connected to a liquid outlet of the circulation pump 40, and the connection point is designated as the point D in FIG. 4; a tail end of the third pipe 303 is connected to the head of the first pipe 301, and the connection point is designated as the point A in FIG. 4.

A head end of the fourth pipe 304 is connected to the tail end of the second pipe 302, and the connection point is designated as the point B in FIG. 4. A tail end of the fourth pipe 304 is connected to a liquid inlet of the circulation pump 40, and the connection point is designated as the point E in FIG. 4.

The circulation pump 40 is configured to circulate the heating liquid in a passage constituted by the third pipe 303, the first pipe 301, the second pipe 302, the fourth pipe 304, and the circulation pump 40.

It can be understood that the circulating pump 40 can inject the heating liquid from the point D to the third pipe 303, and when the heating liquid flows through the third pipe 303, the first pipe 301, the second pipe 302, and the fourth pipe 304, the heating liquid passes through the point D, the point A, the point C, the point B, and the point E sequentially, and finally is discharged from point E to the circulation pump 40, and thus the heating liquid completes one circulation.

Figure 5:
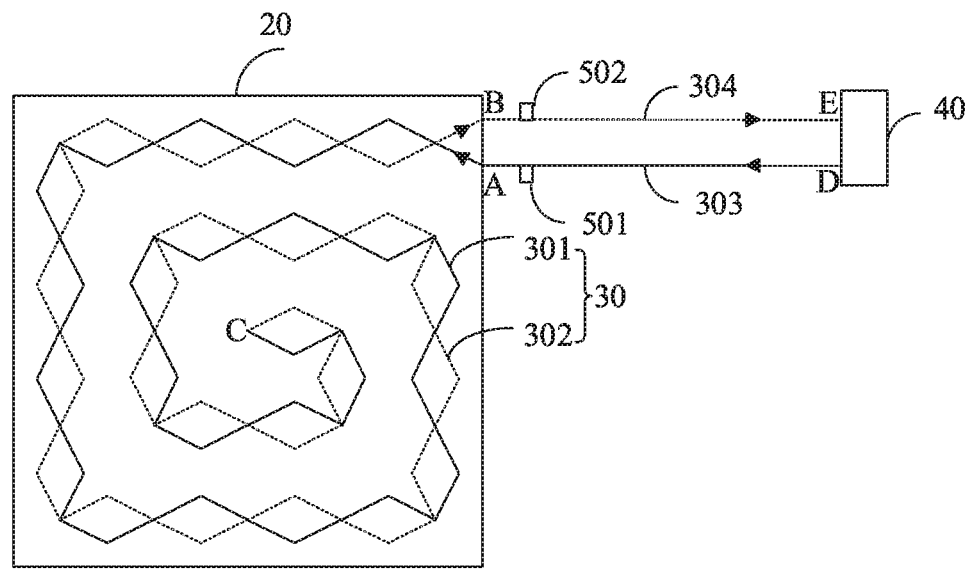
FIG. 5 is a schematic location diagram of a temperature sensor provided by the present application.

In some embodiments, the baking equipment is further described in conjunction with FIG. 5. FIG. 5 is a schematic location diagram of a temperature sensor provided by the present application. As shown in FIG. 5, the baking equipment further includes:

a first temperature sensor 501 and a second temperature sensor 502.

The first temperature sensor 501 is disposed on an outer surface of the third pipe 303 and is configured to monitor a temperature of the heating liquid injected into the first pipe 301. The second temperature sensor 502 is disposed on an outer surface of the fourth pipe 304 and is configured to monitor a temperature of the heating liquid discharged from the second pipe 302.

It should be noted that a position of the first temperature sensor 501 is close to the head end of the first pipe 301. Since the first temperature sensor 501 monitors the temperature of the heating liquid injected into the first pipe 301, the closer it is to the head end of the first pipe 301, the more accurate the monitored temperature is.

Similarly, the position of the second temperature sensor 502 is close to the tail end of the second pipe 302. Since the second temperature sensor 502 monitors the temperature of the heating liquid discharged from the second pipe 302, the closer it is to the tail end of the second pipe 302, the more accurate the monitored temperature is.

The circulation pump 40 is further configured to control the speed of circulating heating liquid according to difference between a temperature monitored by the first temperature sensor 501 and a temperature monitored by the second temperature sensor 502.

It should be noted that the larger the difference between the temperature monitored by the first temperature sensor 501 and the temperature monitored by the second temperature sensor 502, means the more the heat is lost during flowing through the passage formed by the first pipe 301 and the second pipe 302 in the baking plate 20.

It can be understood that, the faster the heating liquid flows, the more the heat is lost, so that in order to reduce the heat loss of the heating liquid, the circulation pump 40 reduces the speed of circulating the heating liquid. When the temperature of the heating liquid needs to be reduced, the circulation pump 40 can increase the speed of circulating the heating liquid.

In some embodiments, the baking equipment further includes:

a heater configured to heat the heating liquid when the temperature monitored by the first temperature sensor 501 is less than a first preset threshold or when the temperature monitored by the second temperature sensor 502 is less than a second preset threshold.

It should be noted that the first preset threshold and the second preset threshold in this embodiment are determined according to the baking temperature actually required for the TFT array substrate 2 to be baked, and the heat loss generated during the heating liquid flows through the passage formed by the first pipe 301 and the second pipe 302 is taken into account, such that the second preset threshold is usually slightly smaller than the first preset threshold. For example, if the actual baking temperature of the TFT array substrate 2 to be baked is 50° C., the first preset threshold is set to 50° C., and the second preset threshold is set to 48° C. When the temperature monitored by the first temperature sensor 501 is less than 50° C., or the temperature monitored by the second temperature sensor 502 is less than 48° C., the heater heats the heating liquid.

Figure 6:
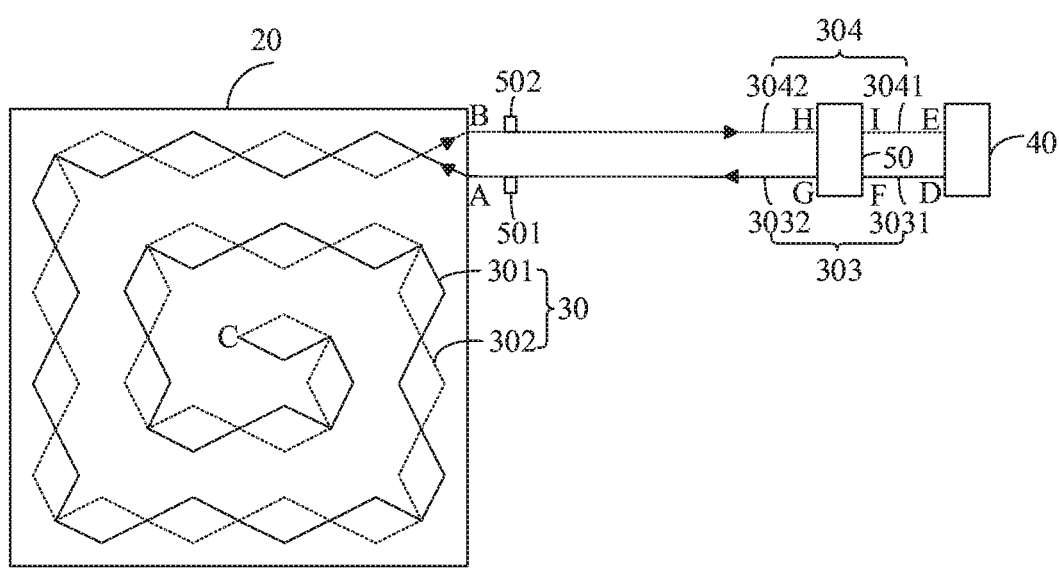
FIG. 6 is a schematic location diagram of a heater provided by the present application.

In some embodiments, the baking equipment is further described with reference to FIG. 6. FIG. 6 is a schematic location diagram of a heater provided in the present application. As shown in FIG. 6, the third pipe 303 includes a first sub-segment 3031 and a second sub-segment 3032.

A head end of the first sub-segment 3031 is connected to the liquid outlet of the circulation pump 40, and the connection point is designated as the point D in FIG. 6. A tail end of the first sub-segment 3031 is connected to a first heating inlet of the heater 50, and the connection point is designated as the point F in FIG. 6. A head end of the second sub-segment 3032 is connected to a first heating outlet of the heater 50, and the connection point is designated as the point G in FIG. 6. A tail end of the second sub-segment 3032 is connected to the head end of the first pipe 301, and the connection point is designated as the point A in FIG. 6.

At this time, the heater 50 heats the heating liquid injected from the first heating inlet, and then discharges the heated heating liquid from the first heating outlet.

The fourth pipe 304 includes a third sub-segment 3041 and a fourth sub-segment 3042.

A head end of the third sub-segment 3041 is connected to the tail end of the second pipe 302, and the connection point is designated as the point B in FIG. 6. A tail end of the third sub-segment 3041 is connected to a second heating inlet of the heater 50, and the connection point is designated as the point H in FIG. 6. A head end of the fourth sub-segment 3042 is connected to a second heating outlet of the heater 50, and the connection point is designated as the point I in FIG. 6. A tail end of the fourth sub-segment 3042 is connected to the liquid inlet of the circulation pump 40, and the connection point is designated as the point E in FIG. 6.

At this time, the heater 50 heats the heating liquid flowing from the second heating inlet, and then discharges the heated heating liquid from the second heating outlet.

Figure 7:
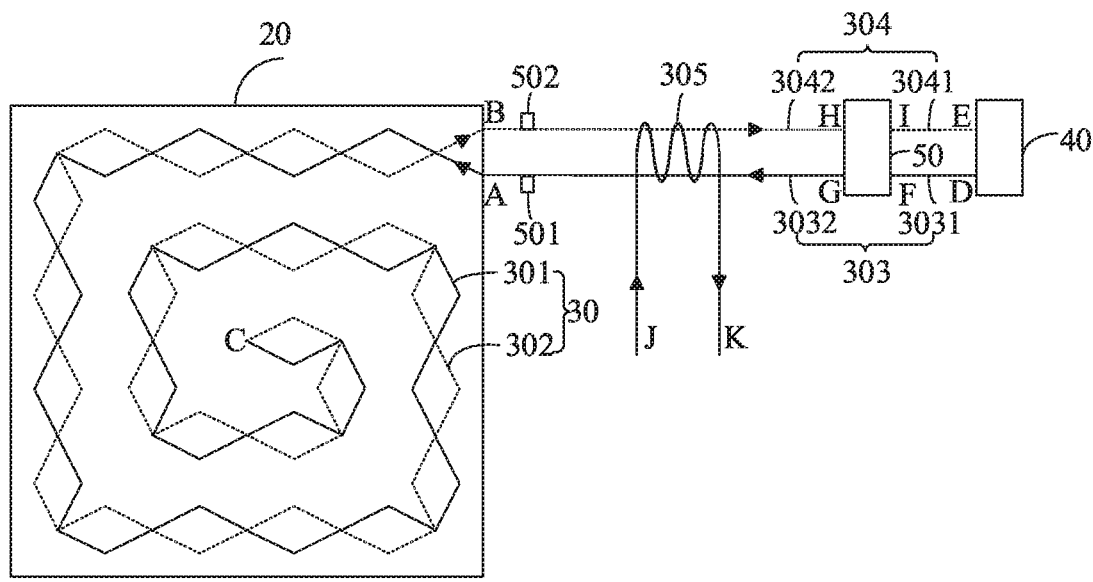
FIG. 7 is a schematic location diagram of a fifth pipe provided by the present application.

In some embodiments, the baking equipment is further described with reference to FIG. 7. FIG. 7 is a schematic location diagram of a fifth pipe provided in the present application. As shown in FIG. 7, the baking equipment further includes:

a fifth pipe 305 spirally wound on outer surfaces of an entire body constituted by the third pipe 303 and the fourth pipe 304 for passing cooling water to cool the heating liquid flowing through the third pipe 303 and the fourth pipe 304.

It can be understood that the cooling water is water whose temperature is lower than the ambient temperature. When the heating liquid needs to be cooled, the cooling water can be injected into the fifth pipe 305. For example, the cooling water is injected from a head end (at the point J in FIG. 7) of the fifth pipe 305, so that when the cooling water flows through a contact surface between the fifth pipe 305 and the third pipe 303 and a contact surface between the fifth pipe 305 and the fourth pipe 304, the heating liquid passing through the third pipe 303 and the fourth pipe 304 transfers heat to the cooling water by heat exchange, thereby reducing the temperature of the heating liquid.

The cooling water is discharged from the tail end (at the point K in FIG. 7) of the fifth pipe 305.

Figure 8:
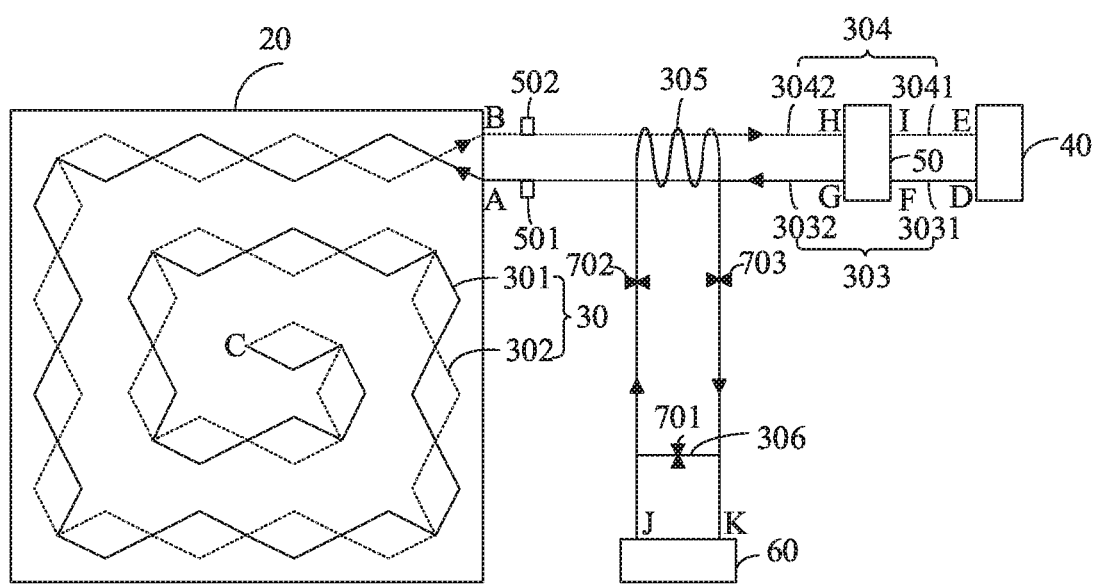
FIG. 8 is a schematic location diagram of a process cooling water system provided by the present application.

In some embodiments, the baking equipment is further described in conjunction with FIG. 8. FIG. 8 is a schematic location diagram of a process cooling water system provided in the present application. As shown in FIG. 8, a head end of the fifth pipe 305 is configured to connect a water outlet of the process cooling water system 60 to receive cooling injected from the water outlet, and the connection point is designated as the point J in FIG. 8.

A tail end of the fifth pipe 305 is configured to connect a water inlet of the process cooling water system 60 to discharge the cooling water flowing through the fifth pipe 305 to the water inlet, and the connection point is designated as the point K in FIG. 8.

The process cooling water system 60 is configured to maintain a circulating supply of cooling water.

The process cooling water system 60 can inject the cooling water into the fifth pipe 305 from the point J, and receive the cooling water discharged from the point K of the fifth pipe 305, and then inject the cooling water into the fifth pipe 305 from the point J to maintain the circulating supply. It should be noted that, because the cooling water discharged from the point K of the fifth pipe 305 obtains heat from the heating liquid, its temperature is higher than its original temperature. In order to better cool the heating liquid, a cooling device can be integrated in the process cooling water system 60 to cool the cooling water received from the point K, and then the cooled cooling water is injected into the fifth pipe 305 from the point J.

It should be noted that, when the heating liquid is not necessary to be cooled, the cooling water in the fifth pipe 305 is discharged. Since the cooling water in the process cooling water system 60 must circulate for a long period of time, a sixth pipe 306 connecting two non-bent segments of the fifth pipe 305 is introduced, and each of the non-bent segments and the sixth pipe 306 is provided with a solenoid valve to control a path that the cooling water flows through.

It can be understood that when the heating liquid needs to be cooled, the first solenoid valve 701 is closed, and a second solenoid valve 702 and a third solenoid valve 703 are opened, so that the cooling water flows through the fifth pipe 305.

When the heating liquid is not necessary to be cooled, the first solenoid valve 701 is opened, and the second solenoid valve 702 and the third solenoid valve 703 are closed, so that the cooling water flows through the sixth pipe 306.

In some embodiments, the baking equipment further includes: a thermal insulation cotton covering an outer surface of the fifth pipe 305.

It can be understood that covering the outer surface of the fifth pipe 305 with thermal insulation can reduce the heat loss of the heating fluid flowing through the third pipe 303 and the fourth pipe 304, and prevent workers from being burn due to touching the third pipe 303, the fourth pipe 304, or the fifth pipe 305, thus playing a safety protection role.

It can be understood that for a person of ordinary skill in the art, equivalent replacements or changes can be made according to the technical solution of the present application and its inventive concept, and all these changes or replacements should fall within the protection scope of the claims attached to this application.

What is claimed is:

1. A baking equipment for use in a display panel manufacturing process, comprising a main body, a baking chamber disposed inside the main body, a baking plate disposed inside the baking chamber, a third pipe, a fourth pipe, a circulation pump, and a fifth pipe spirally wound on outer surfaces of an entire body constituted by the third pipe and the fourth pipe, for passing cooling water to cool the heating liquid flowing through the third pipe and the fourth pipe;

wherein a liquid passing hole is defined inside the baking plate, the liquid passing hole comprises a first pipe and a second pipe, the first pipe and the second pipe are evenly distributed inside the baking plate, and a tail end of the first pipe is connected to a head end of the second pipe to form a passage;

the head end of the first pipe is configured to receive a heating liquid injected from external, and the heating liquid is configured to uniformly heat the baking plate during flowing through the passage, and the tail end of the second pipe is configured to discharge the heating liquid;

a head end of the third pipe is connected to a liquid outlet of the circulation pump, and a tail end of the third pipe is connected to the head end of the first pipe;

a head end of the fourth pipe is connected to the tail end of the second pipe, and a tail end of the fourth pipe is connected to a liquid inlet of the circulation pump; and the circulation pump is configured to circulate the heating liquid in a passage constituted by the third pipe, the first pipe, the second pipe, the fourth pipe, and the circulation pump.

2. The baking equipment for use in the display panel manufacturing process according to claim 1, wherein the first pipe and the second pipe are spirally wound around each other.

3. The baking equipment for use in the display panel manufacturing process according to claim 1, wherein each of the first pipe and the second pipe is distributed in a loop shape inside the baking plate.

4. The baking equipment for use in the display panel manufacturing process according to claim 1, further comprising:

a first temperature sensor and a second temperature sensor;

wherein the first temperature sensor is disposed on an outer surface of the third pipe and is configured to monitor a temperature of the heating liquid injected into the first pipe;

the second temperature sensor is disposed on an outer surface of the fourth pipe and is configured to monitor a temperature of the heating liquid discharged from the second pipe; and the circulation pump is further configured to control a flow speed of circulating the heating fluid according to a difference between a temperature monitored by the first temperature sensor and a temperature monitored by the second temperature sensor.

5. The baking equipment for use in the display panel manufacturing process according to claim 4, further comprising:

a heater configured to heat the heating liquid when the temperature monitored by the first temperature sensor is less than a first preset threshold or when the temperature monitored by the second temperature sensor is less than a second preset threshold.

6. The baking equipment for use in a display panel manufacturing process according to claim 5, wherein the third pipe comprises a first sub-segment and a second sub-segment,
   a head end of the first sub-segment is connected to the liquid outlet of the circulation pump, a tail end of the first sub-segment is connected to a first heating inlet of the heater, a head end of the second sub-segment is connected to a first heating outlet of the heater, and a tail end of the second sub-segment is connected to the head end of the first pipe; and
   the fourth pipe comprises a third sub-segment and a fourth sub-segment,
   a head end of the third sub-segment is connected to the tail end of the second pipe, a tail end of the third sub-segment is connected to a second heating inlet of the heater, and a head end of the fourth sub-segment is connected to a second heating outlet of the heater, and a tail end of the fourth sub-segment is connected to the liquid inlet of the circulation pump.

7. The baking equipment for use in the display panel manufacturing process according to claim 1, wherein a head end of the fifth pipe is configured to connect a water outlet of a process cooling water system to receive the cooling water injected from the water outlet;
   a tail end of the fifth pipe is configured to connect a water inlet of the process cooling water system to discharge the cooling water flowing through the fifth pipe into the water inlet; and
   the process cooling water system is configured to maintain a circulating supply of the cooling water.

8. The baking equipment for use in the display panel manufacturing process according to claim 1, further comprising:
   a thermal insulation cotton covering an outer surface of the fifth pipe.

9. A baking equipment for use in a display panel manufacturing process, comprising a main body, a baking chamber disposed inside the main body, a baking plate provided inside the baking chamber, a third pipe, a fourth pipe, a circulation pump, and a fifth pipe spirally wound on outer surfaces of an entire body constituted by the third pipe and the fourth pipe, for passing cooling water to cool the heating liquid flowing through the third pipe and the fourth pipe, wherein
   a liquid passing hole is defined inside the baking plate, the liquid passing hole comprises a first pipe and a second pipe, the first pipe and the second pipe are evenly distributed inside the baking plate, and a tail end of the first pipe is connected to a head end of the second pipe to form a passage;
   the head end of the first pipe is configured to receive a heating liquid injected from external, and the heating liquid is configured to uniformly heat the baking plate during flowing through the passage, and the tail end of the second pipe is configured to discharge the heating liquid, wherein
   a diameter of each of the first pipe and the second pipe ranges from 5 to 50 mm;
   a head end of the third pipe is connected to a liquid outlet of the circulation pump, and a tail end of the third pipe is connected to the head end of the first pipe;
   a head end of the fourth pipe is connected to the tail end of the second pipe, and a tail end of the fourth pipe is connected to a liquid inlet of the circulation pump; and
   the circulation pump is configured to circulate the heating liquid in a passage constituted by the third pipe, the first pipe, the second pipe, the fourth pipe, and the circulation pump.

10. The baking equipment for use in the display panel manufacturing process according to claim 9, wherein the first pipe and the second pipe are spirally wound with each other.

11. The baking equipment for use in the display panel manufacturing process according to claim 9, wherein each of the first pipe and the second pipe is distributed in a loop shape inside the baking plate.

12. The baking equipment for use in the display panel manufacturing process according to claim 9, further comprising:
   a first temperature sensor and a second temperature sensor; wherein
   the first temperature sensor is disposed on an outer surface of the third pipe and is configured to monitor a temperature of the heating liquid injected into the first pipe;
   the second temperature sensor is disposed on an outer surface of the fourth pipe and is configured to monitor a temperature of the heating liquid discharged from the second pipe; and
   the circulation pump is further configured to control a flow speed of circulating the heating fluid according to a difference between a temperature monitored by the first temperature sensor and a temperature monitored by the second temperature sensor.

13. The baking equipment for use in the display panel manufacturing process according to claim 12, further comprising:
   a heater configured to heat the heating liquid when the temperature monitored by the first temperature sensor is less than a first preset threshold or when the temperature monitored by the second temperature sensor is less than a second preset threshold.

14. The baking equipment for use in a display panel manufacturing process according to claim 13, wherein the third pipe comprises a first sub-segment and a second sub-segment,
   a head end of the first sub-segment is connected to the liquid outlet of the circulation pump, a tail end of the first sub-segment is connected to a first heating inlet of the heater, a head end of the second sub-segment connected to a first heating outlet of the heater, and a tail end of the second sub-segment is connected to the head end of the first pipe; and
   the fourth pipe comprises a third sub-segment and a fourth sub-segment,
   a head end of the third sub-segment is connected to the tail end of the second pipe, a tail end of the third sub-segment is connected to a second heating inlet of the heater, and a head end of the fourth sub-segment is connected to a second heating outlet of the heater, and a tail end of the fourth sub-segment is connected to the liquid inlet of the circulation pump.

15. The baking equipment for use in the display panel manufacturing process according to claim 9, wherein a head end of the fifth pipe is configured to connect a water outlet of a process cooling water system to receive the cooling water injected from the water outlet;
   a tail end of the fifth pipe is configured to connect a water inlet of the process cooling water system to discharge the cooling water flowing through the fifth pipe to the water inlet; and the process cooling water system is configured to maintain a circulating supply of the cooling water.

16. The baking equipment for use in the display panel manufacturing process according to claim 9, further comprising:
   a thermal insulation cotton covering an outer surface of the fifth pipe.

* * * * *